United States Patent
Hafez et al.

(10) Patent No.: US 8,681,573 B2
(45) Date of Patent: *Mar. 25, 2014

(54) PROGRAMMABLE/RE-PROGRAMMABLE DEVICE IN HIGH-K METAL GATE MOS

(71) Applicant: Intel Corporation, Santa Clara, CA (US)

(72) Inventors: Walid M. Hafez, Portland, OR (US); Anisur Rahman, Hillsboro, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/870,598

(22) Filed: Apr. 25, 2013

(65) Prior Publication Data

US 2013/0229882 A1    Sep. 5, 2013

Related U.S. Application Data

(63) Continuation of application No. 12/976,630, filed on Dec. 22, 2010, now Pat. No. 8,432,751.

(51) Int. Cl.
*G11C 7/22* (2006.01)

(52) U.S. Cl.
USPC .......... 365/189.16; 365/189.15; 365/189.011; 365/189.07; 365/189.09; 365/185.03; 365/185.14; 365/185.18; 365/185.19; 365/185.21; 365/185.23

(58) Field of Classification Search
USPC .......... 365/189.16, 189.15, 189.011, 189.07, 365/189.09, 185.03, 185.14, 185.18, 365/185.19, 185.21, 185.23
See application file for complete search history.

(56) References Cited

U.S. PATENT DOCUMENTS

| 5,412,593 A | 5/1995 | Magel et al. |
| 6,836,000 B1 | 12/2004 | Marr et al. |
| 7,378,718 B2 | 5/2008 | Tsutsui |

(Continued)

FOREIGN PATENT DOCUMENTS

WO    2012/087586 A2    6/2012

OTHER PUBLICATIONS

Wang et al., "Improving SRAM Vmin and Yield by Using Variation-Aware BTI Stress", Intel Corporation, Hillsboro, OR 97124, University of Virginia, 351 McCormick Rd., Charlottesville, VA 22904, Custom Integrated Circuits Conference (CICC), 2010 IEEE, ISSN: 0886-5930, 2010, 4 pages.

(Continued)

*Primary Examiner* — Fernando Hidalgo
(74) *Attorney, Agent, or Firm* — Finch & Maloney PLLC

(57) ABSTRACT

Techniques and circuitry are disclosed for implementing non-volatile storage that exploit bias temperature instability (BTI) effects of high-k/metal-gate n-type or p-type metal oxide semiconductor (NMOS or PMOS) transistors. A programmed bitcell of, for example, a memory or programmable logic circuit exhibits a threshold voltage shift resulting from an applied programming bias used to program bitcells. In some cases, applying a first programming bias causes the device to have a first state, and applying a second programming bias causes the device to have a second state that is different than the first state. Programmed bitcells can be erased by applying an opposite polarity stress, and re-programmed through multiple cycles. The bitcell configuration can be used in conjunction with column/row select circuitry and/or readout circuitry, in accordance with some embodiments.

24 Claims, 10 Drawing Sheets

(56) References Cited

U.S. PATENT DOCUMENTS

| | | |
|---|---|---|
| 7,601,564 B2 | 10/2009 | Okayama |
| 7,643,357 B2 | 1/2010 | Braceras et al. |
| 8,432,751 B2 | 4/2013 | Hafez et al. |
| 2006/0285393 A1 | 12/2006 | Paillet et al. |
| 2009/0080232 A1 | 3/2009 | Chen et al. |
| 2009/0152642 A1 | 6/2009 | Bojarczuk et al. |
| 2009/0154248 A1* | 6/2009 | Noda ................. 365/185.18 |
| 2009/0207650 A1 | 8/2009 | Braceras et al. |
| 2009/0207655 A1 | 8/2009 | Kalnitsky et al. |
| 2009/0321838 A1 | 12/2009 | Sell et al. |
| 2010/0013021 A1 | 1/2010 | Chen et al. |
| 2010/0038724 A1 | 2/2010 | Anderson et al. |
| 2010/0164603 A1 | 7/2010 | Hafez et al. |
| 2010/0165699 A1 | 7/2010 | Chen et al. |
| 2011/0013445 A1* | 1/2011 | Dewanz et al. ............. 365/148 |
| 2011/0032742 A1* | 2/2011 | Hui et al. ................ 365/104 |

OTHER PUBLICATIONS

International Search Report and Written Opinion received for PCT Application No. PCT/US2011/063846, mailed on Jul. 24, 2012, 9 pages.

International Preliminary Report on Patentability and Written Opinion received for PCT Application No. PCT/US2011/063846, mailed on Jul. 4, 2013, 6 pages.

* cited by examiner

Layout Legend:
 - Metal Interconnect
 - Diffusion
 - Gate
 - Contact

PROGRAMMABLE/RE-PROGRAMMABLE DEVICE IN HIGH-K METAL GATE MOS

RELATED APPLICATION

This application is a continuation of U.S. application Ser. No. 12/976,630 filed Dec. 22, 2010, now U.S. Pat. No. 8,432,751, which is herein incorporated by reference in its entirety.

BACKGROUND

Metal fuse and antifuse arrays are commonly used for non-volatile, complementary metal oxide semiconductor (CMOS) compatible storage. For example, programmable memory devices such as programmable read-only memory (PROM) and one-time programmable read-only memory (OTPROM) are typically programmed by either destroying links (via a fuse) or creating links (via an antifuse) within the memory circuit. In PROMs, for instance, each memory location or bitcell contains a fuse and/or an antifuse, and is programmed by triggering one of the two. The programming is usually done after manufacturing of the memory device, and with a particular end-use or application in mind. Once conventional bitcell programming is performed, it is generally irreversible.

Fuse links are commonly implemented with resistive fuse elements that can be open-circuited or 'blown' with an appropriate amount of high-current. Antifuse links, on the other hand, are implemented with a thin barrier layer of non-conducting material (such as silicon dioxide) between two conductor layers or terminals, such that when a sufficiently high voltage is applied across the terminals, the silicon dioxide or other such non-conducting material is effectively turned into a short-circuit or otherwise low resistance conductive path between the two terminals.

Conventional fuse and antifuse links for use in programming memory are associated with a number of non-trivial issues.

BRIEF DESCRIPTION OF THE DRAWINGS

FIG. 1b illustrates an equivalent circuit of the example memory cell shown in FIG. 1a.

DETAILED DESCRIPTION

Figure 1A:
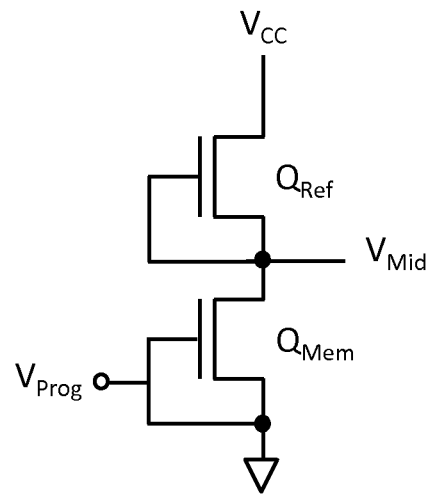
FIG. 1a illustrates a schematic of a memory cell configured in accordance with an embodiment of the present invention.

Techniques and circuitry are disclosed for implementing low power and low voltage non-volatile storage that exploit bias temperature instability (BTI) effects of high-k/metal-gate metal oxide semiconductor (MOS) transistors, including both n-type MOS (NMOS) and p-type MOS (PMOS) transistors. A programmed bitcell of, for example, a memory or programmable logic circuit exhibits a threshold voltage shift resulting from an applied stress used to program bitcells. Programmed bitcells can be erased by applying an opposite polarity stress, and re-programmed through multiple cycles with minimal degradation of the storage capability. The bitcell configuration, which can be used in conjunction with column/row select circuitry, and/or readout circuitry, allows for high-density memory array circuit designs and layouts, in accordance with various embodiments of the present invention. The techniques can be embodied, for example, in discrete memory devices (e.g., non-volatile memory chips), integrated system designs (e.g., purpose-built silicon), or on-chip memory (e.g., microprocessor with on-chip non-volatile cache). Other embodiments that can employ techniques described herein, such as programmable logic circuits (e.g., field programmable gate array or field programmable analog arrays) and other devices that require storage of digital or analog bit values, will be apparent in light of this disclosure.

General Overview

As previously noted, conventional fuse and antifuse links for use in programming memory are associated with a number of non-trivial issues. For instance, metal fuses require high currents (milliamp levels) to program a bitcell. Such high currents require physically large programming transistors which in turn limit the minimum die size of the memory device. The requisite high current also limits the number of cells that can be simultaneously programmed. In addition, to enable secure fuses (such as those that are NDS-compliant or otherwise tamper proof to a desired degree or in accordance with a given security or digital rights management standard), careful design of the fuse cell and programming conditions is necessary to limit any post-programming detectability.

Embodiments of the present invention can be used to eliminate or otherwise mitigate the high-power requirements of conventional metal and antifuse technologies, as well as the difficulty associated with establishing a secure memory cell. In addition, some such embodiments can be configured to enable multiple levels of programming and/or the ability to erase and re-program multiple times, which conventional devices do not support. One specific embodiment employs a high-k/metal gate logic transistor, stressed in strong inversion (below the breakdown voltage of the oxide) to induce a positive bias temperature instability (BTI) or traps in the high-k gate oxide. The traps create an increase in the threshold voltage ($V_t$) of the transistor, thereby effectively programming the memory cell, by virtue of its unique $V_t$ relative to unprogrammed cells. As is generally known, $V_t$ is the approximate voltage where a transistor strong inverts in the channel (turns-on). For gate voltages below $V_t$, the transistor is comparable to a digital switch in the off position, and for gate voltages above $V_t$, the transistor is comparable to a digital switch in the on position. Once the transistor is on, current can freely flow between its source and drain.

In any case, multiple programming events on a single memory element will enable discretized increases in the threshold voltage $V_t$, thereby allowing for multiple levels of programming. In some embodiments, applying opposite polarity stresses can be used to return the memory element to a previous state, or even unprogram the memory element by returning $V_t$ to its unprogrammed value (or otherwise within a predefined tolerance of that value, such as within 10%). The memory element of the bitcell can then be re-programmed, if so desired. Comparator/sense amplifier circuitry can be configured for detection of a programmed cell against a local reference.

BTI is well-known in the context of complementary metal oxide semiconductor (CMOS) reliability. However, using or otherwise exploiting BTI as described herein is atypical, in that long standing industry practice is to minimize BTI effects through oxide and dielectric interface optimization. In more detail, reduction of BTI is normally desirable as circuit functionality and performance may deteriorate as threshold voltages shift due to stress or aging. For example, in CMOS static random access memory (SRAM) cells, the cell stability is governed by the relative strengths of the NMOS and p-type MOS (PMOS) transistors. As BTI weakens the transistors, the strength of the transistors shift relative to each other and create cell stability issues along with degradations in read/write behavior and degraded static noise margins. Such BTI degradation impacts not only SRAM devices, but standard logic transistors. For example, silicon dioxide ($SiO_2$) based NMOS transistors experience BTI when biased in accumulation. Typically, such BTI effects are carefully monitored and minimized during process development. While $SiO_2$-based devices do not exhibit strong positive BTI (biased in inversion) characteristics, high-k/metal gate NMOS transistors exhibit a very strong coupling between high inversion bias and threshold voltage shifts. To this end, embodiments of the present invention can be configured to intentionally exploit degradation from BTI mechanisms in a high-k/metal gate NMOS (or PMOS) device to create a non-volatile memory cell. By purposefully stressing the appropriate transistors in a given memory array, stable and reproducible shifts in the device threshold voltage $V_t$ can be induced, with the magnitude of the $V_t$ shift being a function of the stress voltage and time (and in some example cases, temperature). Once stressed, the element will retain the shifted device characteristics indefinitely, hence acting as a storage element.

As will be appreciated in light of this disclosure, a high-k metal gate BTI memory element configured in accordance with an embodiment can be designed using either N or P type devices. However, embodiments employ high-k metal gate NMOS transistors may be more desirable, depending on factors such as the specific application, the magnitude of the shift in $V_t$, and the sensitivity of the readout circuit. For instance, in high-k metal gate technology, although the high-k gate oxides/dielectrics for both NMOS and PMOS can be similarly composed and may both include a relatively thin interfacial layer (e.g., silicon dioxide, $SiO_2$) beneath the high-k oxide layer, their physical mechanisms for BTI are different. BTI in NMOS involves electrically charged traps accumulating in the high-k oxide layer alone, which is a controlled phenomenon and can be completely de-trapped by applying reverse electrical bias. On the other hand, BTI in PMOS involves charged traps created in the interfacial layer alone. In this case, resulting $V_t$ shifts display a wider scattering, and may therefore be less controllable and cannot be completely de-trapped, which may, for instance, complicate detection of smaller $V_t$ shifts. Given potential for greater desirability associated with NMOS-based embodiments, the present disclosure tends to focus on NMOS implementations. Nonetheless, both NMOS and PMOS can be used to implement a BTI memory as described herein, and the claimed invention is not intended to be limited to NMOS.

Thus, while conventional memory elements generally rely on the programming to create electro-migration or oxide breakdown events inducing hard open/shorts, embodiments of the present invention rely on injecting charge and creating traps in the oxide to produce state changes. Because no breakdown event is needed, the power required to program an element is substantially lower than conventional one-time-programmable CMOS-compatible memories. For example, a conventional oxide antifuse requires about 4V and at the breakdown event, the current is in the range of hundreds of microamps ($\mu A$) to the low milliamps (mA) range per bit. So, assuming a 1 mA programming current, 4 milliwatts (mW) of power would be needed (i.e., 4V*1 mA). A conventional metal fuse requires even higher power, with typical programming currents in the milliamp range. In accordance with one embodiment, the programming voltage can be set to about 2.5V and the total power is dominated by the gate current flowing through the oxide, which at 2.5V would be, for example, about $10^{-8}$ to $10^{-7}$ amps, thereby resulting in power dissipation in the nanowatt (nW) range, which is very low relative to power dissipation in the milliwatt range for conventional devices.

As will be appreciated in light of this disclosure, there are a number of advantages associated with the various techniques described herein. For example, and in accordance with one embodiment, secure storage devices are enabled wherein programmed and unprogrammed bitcells of the device are indistinguishable using conventional failure analysis, reverse engineering, and/or hacking techniques (e.g., such as those used to detect encryption keys hidden in memory locations reserved for digital rights management). In some embodiments, very small bitcell sizes can be implemented, such as those configured with only two to four logic transistors, thereby allowing for further scaling of memory architecture and reduction in die size. Functions such as charge-pumping, level shifting, and/or high current draws such as in conventional metal fuse and antifuse designs need not be employed. In addition, some embodiments can be configured such that a very low voltage (e.g., <0.5 volts) can be used for readout, and/or a very low current (e.g., <1.0 $\mu A$) can be used to program. A bitcell (sometimes called a memory cell) can be erased and re-programmed through many cycles, in some embodiments.

Memory Cell Architecture

Figure 1B:
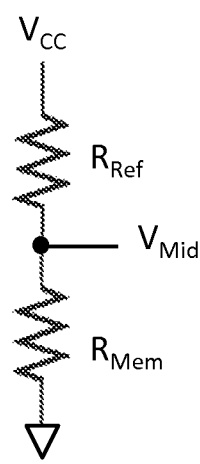

FIG. 1a illustrates a schematic of a memory cell configured in accordance with an embodiment of the present invention. As can be seen, this example cell configuration includes two stacked logic NMOS transistors, where the top transistor ($Q_{Ref}$) is used as a local reference element, and the bottom transistor ($Q_{Mem}$) is the memory element. The equivalent circuit shown in FIG. 1b can be thought of as two resistors in series, with the mid-node voltage between the resistors designated as $V_{Mid}$. In the unprogrammed state, the cell resistances of the reference element ($R_{Ref}$) and the memory element ($R_{Mem}$) are substantially identical (e.g., within +/−10% of each other, or other suitable tolerance). For an applied $V_{CC}$, the mid-node voltage $V_{Mid}$ would then be $V_{CC}/2$.

To program the memory element $Q_{Mem}$ of this example embodiment, the $V_{CC}$ and $V_{Mid}$ nodes are pulled to ground, and a programming bias ($V_{Prog}$) is applied to the gate of $Q_{Mem}$, thereby creating a high gate to drain bias and hot carrier effect. In accordance with one such embodiment, the programming bias $V_{Prog}$ is high enough to induce BTI, but not high enough to create oxide breakdown. After programming, the reference transistor $Q_{Ref}$ remains unchanged, but the memory element $Q_{Mem}$ undergoes a $V_t$ shift due to BTI. In one specific example embodiment, assume that $Q_{Ref}$ and $Q_{Mem}$ are implemented with high-k+metal gate NMOS transistors fabricated using conventional 32 nm process technology, and that the corresponding breakdown voltage is typically about 2.6V. By stressing $Q_{Mem}$ of this example at voltages in the range of about 2-2.4V for a short duration (e.g., 5 seconds or less, such as 1 second), threshold voltage $V_t$ shifts of, for example, of 200 mV or greater can be achieved. This in turn increases $R_{Mem}$ by, for example, more than 10× from $Q_{Ref}$, thereby pulling the mid-node voltage $V_{Mid}$ closer to $V_{CC}$. This swing of the $V_{Mid}$ voltage can then be detected using conventional comparator/sense amplifier techniques.

TABLE 1

| Unprogrammed | Programmed |
| --- | --- |
| $R_{Mem} = R_{Ref}$ | $R_{Mem} = 10 * R_{Ref}$ |
| $V_{Mid} = V_{CC}/2$ | $V_{Mid} = >0.9 * V_{CC}$ |

Table 1 summarizes the relationship between $R_{Mem}$ and $R_{Ref}$ as well as between $V_{Mid}$ and $V_{CC}$, with respect to programmed and unprogrammed states of a memory cell configured in accordance with this example embodiment of the present invention. In general, the unprogrammed state is associated with relatively low resistance and low $V_t$, and the programmed state is associated with relatively high resistance and high $V_t$. Other embodiments of the present invention may be configured to exhibit smaller or larger increases in $R_{Mem}$, thereby resulting in correspondingly smaller or larger swings in $V_{Mid}$. In any such cases, this swing of $V_{Mid}$ can then be detected by the readout circuit, in accordance with some embodiments of the present invention.

As will be appreciated in light of this disclosure, BTI allows for systematic, stable change in $V_t$, as well as other parameters such as transconductance $g_m$ and drain/source current $I_{DS}$, due to formation bulk/interface states and charge trapping in the high-k oxide of $Q_{Mem}$. Such systematic and stable change characteristics effectively allow BTI on high-k/metal gate NMOS (or PMOS, depending on factors such as desired controllability as previously explained) transistors to be used as a memory storage element. As will be further appreciated in light of this disclosure, note that the $V_t$ shift during programming/unprogramming can be flexible based on factors such as the overall circuit architecture of the storage device and/or sensitivity of the readout circuit.

For example, the architecture may not need a large $V_t$ shift to detect a programmed bit (e.g., a 100 mV or lower shift in $V_t$ may be used rather than a 200 mV or greater shift in $V_t$). In such lower $V_t$ shift configurations (e.g., $V_t$ shift of 80 mV or 140 mV), the programming requirements are reduced (e.g., lower programming voltage and/or shorter programming time can be used to induce the smaller $V_t$ shift). In general, the $V_t$ shift may range from 50 mV to 500 mV, in accordance with some embodiments of the present invention (e.g., such as a $V_t$ shift of about 75 mV, 125 mV, 150 mV, 175 mV, 425 mV, 450 mV, or 475 mV). In addition, for memory array architectures implementing an access transistor to buffer the memory element from the sense/readout circuitry, a smaller $V_t$ shift requirement can have the added benefit of enabling a lower-voltage access transistor (given that lower-voltage transistors are typically smaller than higher-voltage transistors).

Thus, and in accordance with an embodiment of the present invention, by applying a thin-gate high-k oxide NMOS transistor under moderate stress (e.g., below oxide breakdown, about 2.5V in inversion), BTI phenomena can be used to 'program' the NMOS transistor resulting in a stable shift in $V_t$. The shifted $V_t$ can be sensed using standard or custom memory array techniques, such as those used in antifuse/metal fuse implementations. By controlling the number of programming pulses $V_{Prog}$, discrete shifts of $V_t$ can be created, thereby enabling a memory element that can be programmed to multiple levels. Similarly, by applying a negative bias (below the breakdown voltage of the transistor), the threshold voltage $V_t$ can be recovered back to an earlier programmed level or even the unprogrammed level (or sufficiently close thereto such that any difference would be negligible). This exploitable NMOS BTI behavior is exhibited, for example, in high-k/metal gate architectures. However, other suitable transistor architectures that exhibit similar exploitable BTI behavior can be used as well, as will be apparent in light of this disclosure.

Figure 2A:
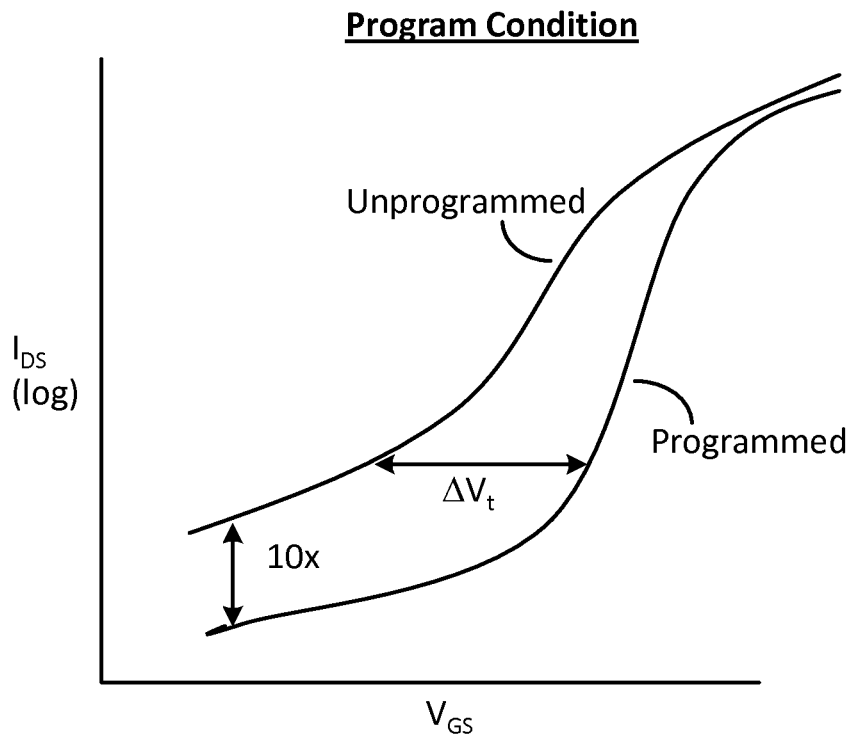
FIGS. 2a and 2b illustrate program and sense conditions, respectively, of a memory cell configured in accordance with an embodiment of the present invention.
Figure 2B:
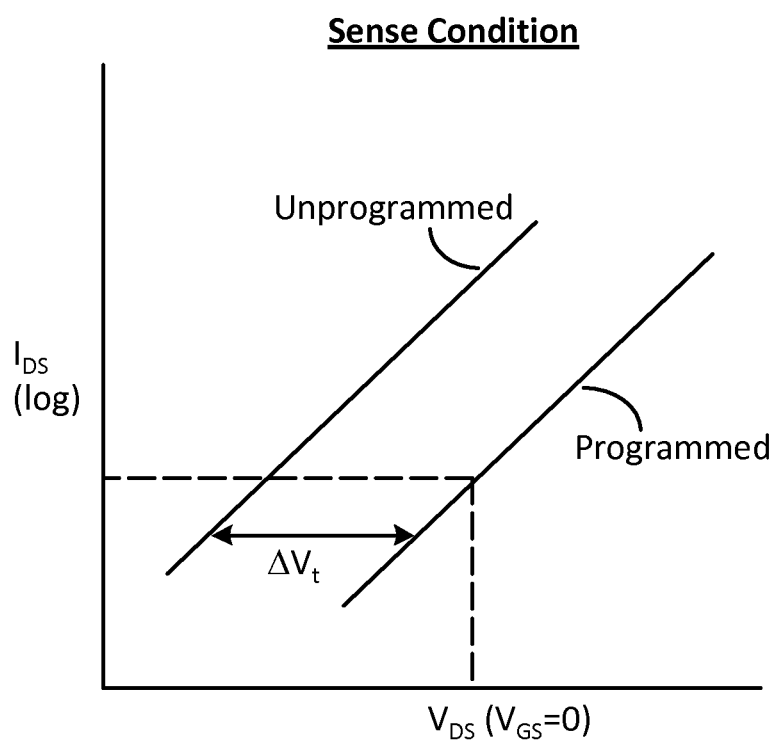

FIGS. 2a and 2b illustrate current/voltage characteristics for program and sense conditions, respectively, of a memory element configured in accordance with an embodiment of the present invention. In particular, FIG. 2a compares the $I_{DS}/V_{GS}$ behavior of an unprogrammed and a programmed cell. As can be seen, the largest separation in unprogrammed/programmed $I_{DS}$ current is at low $V_{GS}$ (designated 10× in this example embodiment), which is why the memory element $Q_{Mem}$ of the memory cell shown in FIG. 1a is configured with its gate tied to its source. The $V_{GS}$ shift resulting from programming is designated $\Delta V_t$. FIG. 2b shows that, for a given $V_{CC}(V_{DS})$, the $I_{DS}$ through both the unprogrammed and programmed versions of $Q_{Mem}$ will be the same. The unprogrammed $Q_{Mem}$ will have a lower voltage drop across it, and the majority of the applied $V_{CC}$ will be dropped across the programmed $Q_{Mem}$.

Memory Cell Operation

Figure 2C:
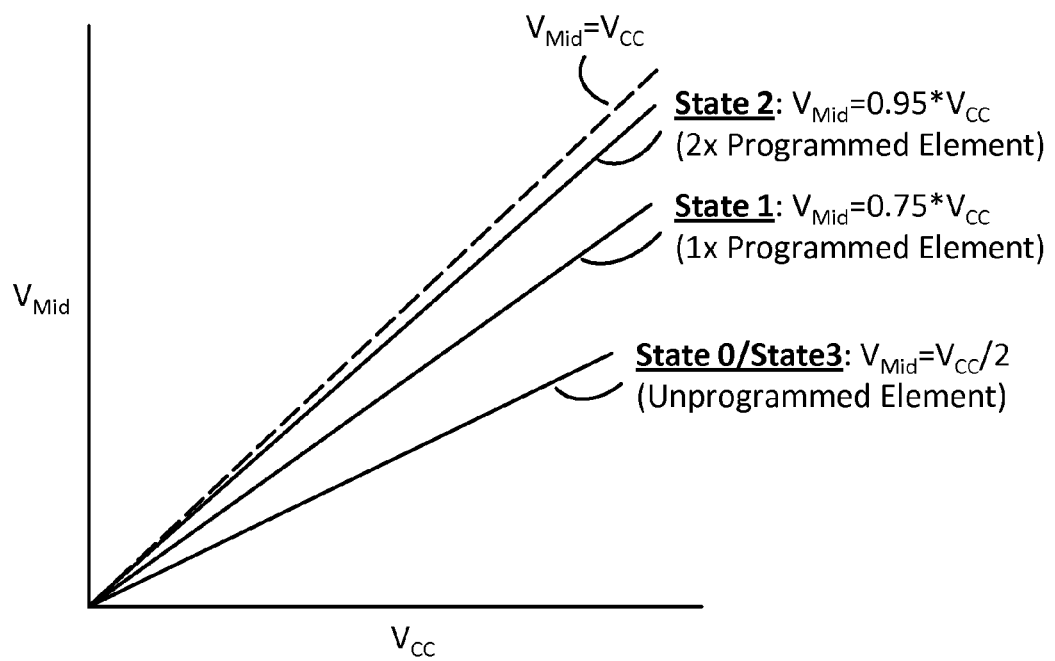
FIG. 2c illustrates example programming states of a memory cell configured in accordance with an embodiment of the present invention.

As previously explained, and in accordance with an embodiment of the present invention, an unprogrammed cell has the memory element resistance $R_{Mem}$ equal to reference $R_{Ref}$, so $V_{Mid}$=50% $V_{CC}$. After programming, the $V_t$ shift induces a decrease (e.g., 10× or better) in current, representing a corresponding increase (e.g., 10× or better) in resistance $R_{Mem}$. The voltage divider between $R_{Mem}$ and $R_{Ref}$ thus pulls $V_{Mid}$ higher. FIG. 2c illustrates various example programming states of a memory cell configured in accordance with an embodiment of the present invention.

As can be seen, state 0 represents the unprogrammed state ($V_{Mid}$=50% $V_{CC}$). State 1 and state 2 represent two different threshold voltages of the programmed memory element $Q_{Mem}$. In this example embodiment, state 2 has a higher $V_t$ than state 1 ($V_{Mid}$=95% $V_{CC}$ for state 2 verse $V_{Mid}$=$V_{CC}$75% for state 1), achieved by repeated programming/stressing of the memory element $Q_{Mem}$. The threshold voltage $V_t$ shift in each of the programmed states is stable after programming and will not change in a material way unless the memory element $Q_{Mem}$ is stressed again during a subsequent programming/unprogramming process. The dashed line shows the extreme state where $V_{Mid}=V_{CC}$, in cases where resistance $R_{Mem}$ is sufficiently high such that the value of $R_{Ref}$ is effectively negligible.

As can be further seen in FIG. 2c, a bit or other stored piece of data (digital or analog) reflected by a programmed state (e.g., state 1 or state 2 in the this example) can be erased or unprogrammed so as to return the memory element $Q_{Mem}$ to its initial $V_t$ value by applying a negative stress to the gate of $Q_{Mem}$ with approximately the same magnitude as the programming voltage. This erasing or unprogramming of data previously stored in $Q_{Mem}$ is represented as state 3 in FIG. 2c.

Figure 3:
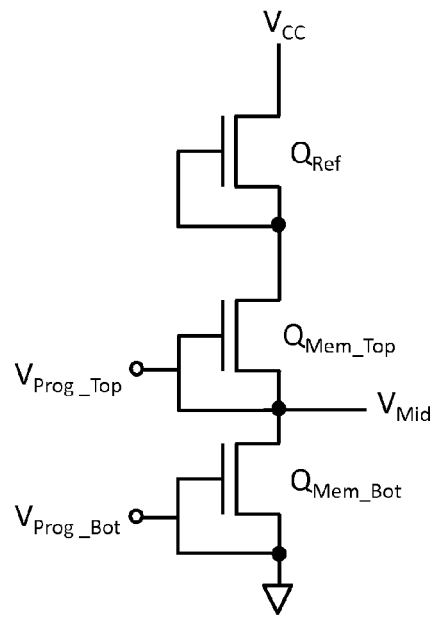
FIG. 3 illustrates a schematic of a memory cell configured in accordance with another embodiment of the present invention.
Figure 4:
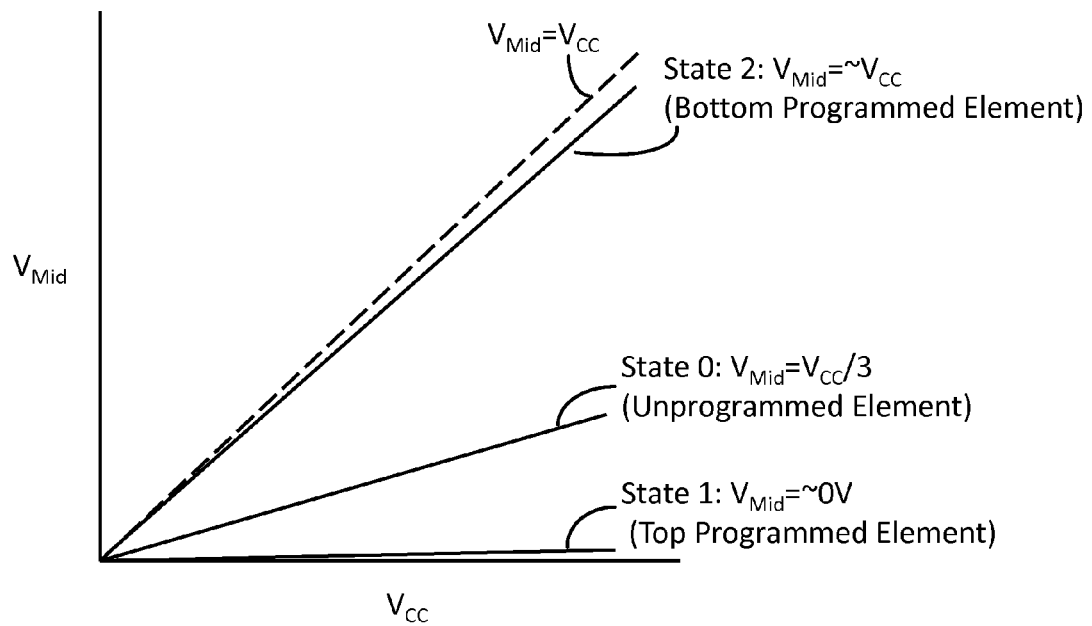
FIG. 4 illustrates example programming states of a multi-level state memory cell configured in accordance with an embodiment of the present invention.

FIG. 3 illustrates a schematic of a memory cell configured in accordance with another embodiment of the present invention. As can be seen, the example cell layout utilizes three in-parallel transistors ($Q_{Ref}$, $Q_{Mem\_Top}$, and $Q_{Mem\_Bot}$) to enable multi-level states, with the sense voltage $V_{Mid}$ placed between the top and bottom memory elements $Q_{Mem\_Top}$ and $Q_{Mem\_Bot}$. $Q_{Ref}$ acts as the reference transistor. Unprogrammed, the voltage divider of the memory cell is split amongst three resistors represented by $Q_{Ref}$, $Q_{Mem\_Top}$, and $Q_{Mem\_Bot}$ and $V_{Mid}=V_{CC}/3$, in accordance with one such example embodiment. This unprogrammed state of the memory cell is depicted as state 0 in FIG. 4.

When $Q_{Mem\_Bot}$ is programmed (by application of programming bias $V_{Prog\_Bot}$), the memory cell behaves as previously described and the $V_{Mid}$ sense node is pulled toward $V_{CC}$. This is depicted as state 2 in FIG. 4. When $Q_{Mem\_Top}$ is programmed (by application of programming bias $V_{Prog\_Top}$), $V_{CC}$ is pulled toward $V_{SS}$ (which is ground or zero volts in this example case), as the resistance above the $V_{Mid}$ sense node will be higher than the bottom node. This is depicted as state 1 in FIG. 4. As will be appreciated in light of this disclosure, each of $V_{Prog\_Bot}$ and $V_{Prog\_Top}$ can be pulsed for a suitable duration or otherwise systematically applied to cause corresponding discrete shifts of $V_t$ until desired levels of $V_t$ or $V_{Mid}$ are reached. The dashed line in this example shows the extreme state where $V_{Mid}=V_{CC}$, in cases where the resistance associated with $Q_{Mem\_Bot}$ is sufficiently high such that the combined resistance associated with $Q_{Mem\_Bot}$ and $Q_{Ref}$ is effectively negligible.

Figure 5A:
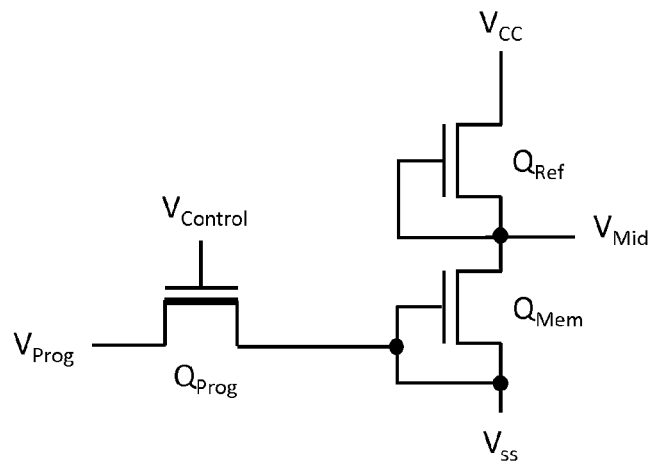
FIGS. 5a and 5b respectively illustrate a schematic of a memory cell and the corresponding cell layout, configured in accordance with another embodiment of the present invention.

FIG. 5a illustrates a schematic of a memory cell configured in accordance with another embodiment of the present invention. This cell configuration is similar to the one described with reference to FIGS. 1a and 1b, and that previous description is equally applicable here. In this example configuration, however, a programming transistor $Q_{Prog}$ is included in the memory cell and is used to control access to each memory element $Q_{Mem}$ (or storage bit). As will be appreciated, $Q_{Prog}$ can be implemented with a thick-gate or thin-gate device. Using a thin-gate device allows the bitcell area to be smaller. Note, however, that such programming transistors and any access transistors can be external to the memory cell or otherwise eliminated.

Figure 5B:
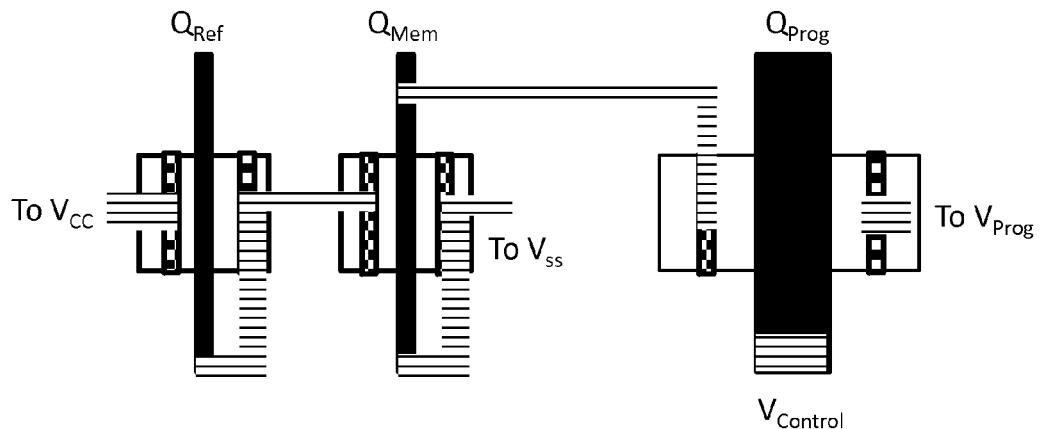
Figure 5B:
Figure 5B:
Figure 5B:
Figure 5B:

FIG. 5b illustrates an example layout of the cell, showing each of the metal interconnects, diffusion, gate, and contact areas. Other typical cell features, such as the substrate, dielectric layers, passivation layers, doped areas, vias, etc. will be apparent in light of this disclosure. The programming transistor $Q_{Prog}$ is shown as a thick-gate device, but again can be any suitable device. The layout is not necessarily drawn to scale or intended to limit the claimed invention in any way. For instance, while the top view shown in FIG. 5b generally indicates straight lines, right angles, and smooth surfaces, an actual implementation of the cell may have less than perfect straight lines, right angles, and some features may have surface topology or otherwise be non-smooth, given real world limitations of the processing equipment and techniques used. In short, FIG. 5b is provided merely to show one possible example cell layout scheme.

Example Implementation Data

Figure 6A:
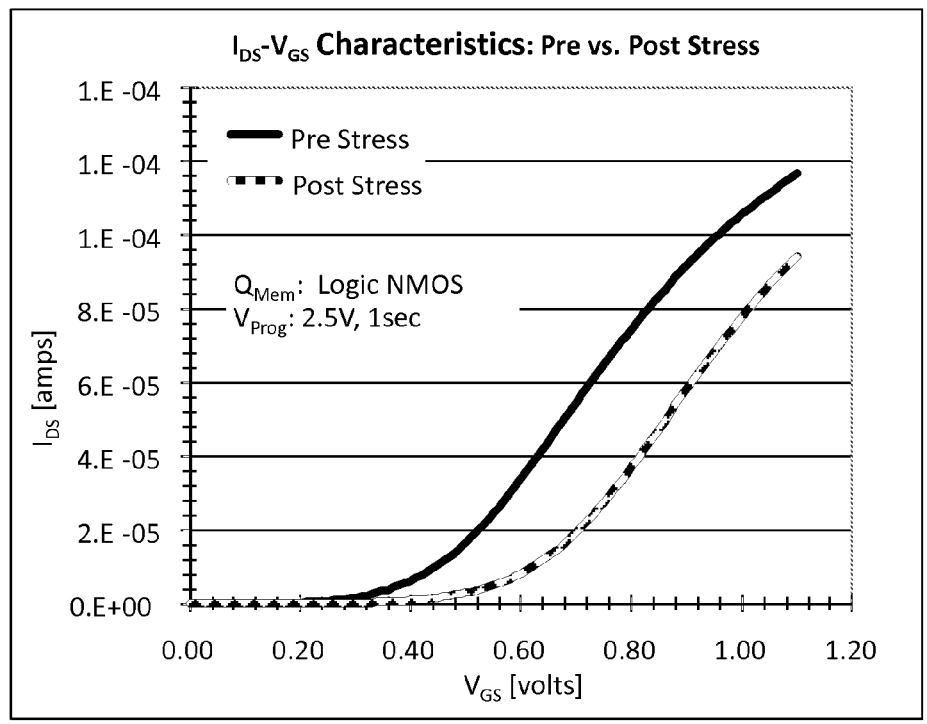
FIGS. 6a and 6b each illustrate pre- and post-programming plots of $I_{DS}$-$V_{GS}$ characteristics of a memory element configured in accordance with an embodiment of the present invention.
Figure 6B:
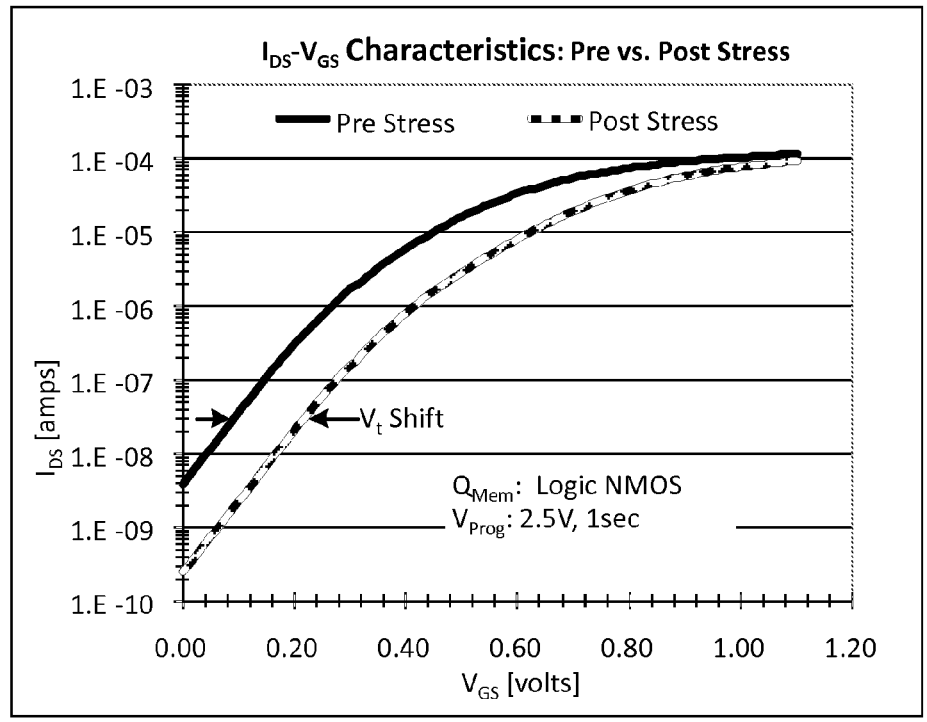

The plots of FIGS. 6a and 6b effectively show the BTI effects on a memory element (e.g., $Q_{Mem}$), which can be implemented with a conventional thin-gate logic NMOS transistor, in accordance with an embodiment of the present invention. Note that FIG. 6a has a linear y-axis, while FIG. 6b has a logarithmic y-axis, with each plot highlighting different characteristics between example programmed and unprogrammed transistor devices. The solid curve shown in the plots represents the transistor $I_{DS}$-$V_{GS}$ characteristics prior to application of the programming bias $V_{Prog}$ (i.e., pre-stress), while the dotted curve demonstrates the $V_t$ shift achieved with a programming bias $V_{Prog}$ in the form of a 2.5V, 1 to 2 second programming pulse. A stable shift in $V_t$ in the range of 150 mV to 200 mV was achieved. Note that any number of different programming biases can be used, with respect to duration and magnitude. The magnitude and duration of the programming signal will depend, for example, on factors such as the programming element's construction and the environmental conditions under which programming is performed. For example, while a memory cell configured in accordance with embodiments of the present invention can be programmed at any temperature, higher temperatures can be used to provide faster programming in accordance with some embodiments. Thus, if faster programming times are desired, programming can be performed at elevated temperatures (e.g., 90° C. for 500 millisecond 2.5V pulse). Also, and as previously explained, any number of suitable $V_t$ (or alternatively, $V_{Mid}$) shifts can be used as will be appreciated.

Figure 7A:
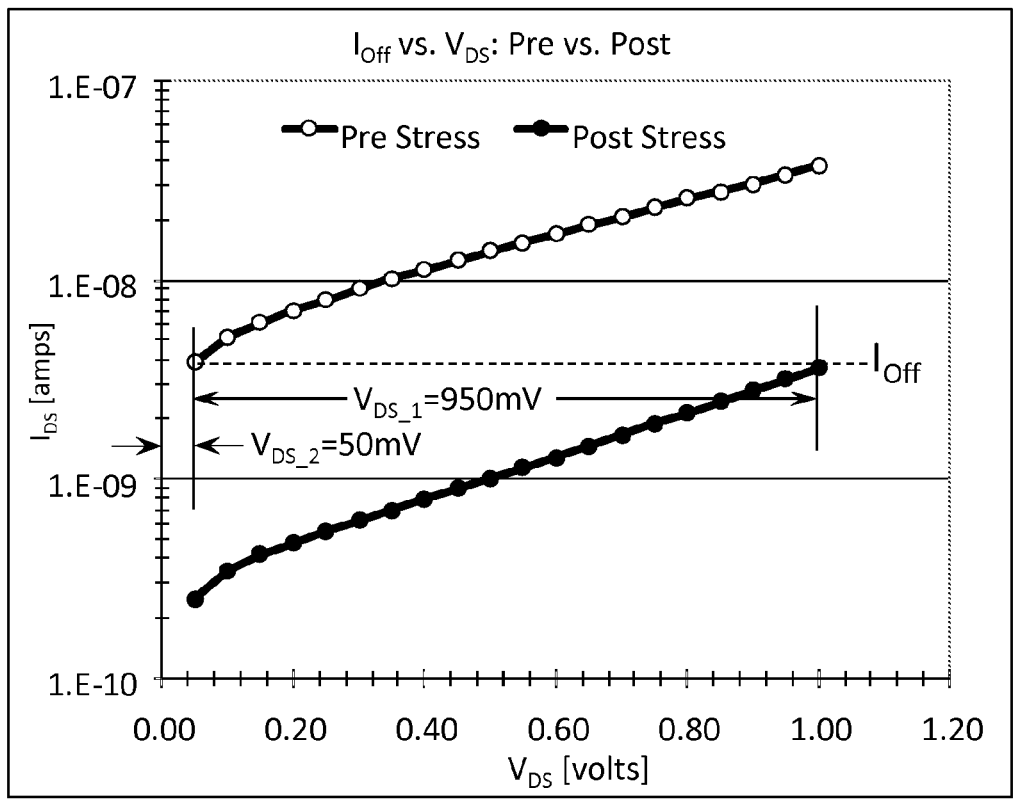
FIG. 7a illustrates pre- and post-programming plots of $I_{Off}$-$V_{DS}$ characteristics of a memory element configured in accordance with an embodiment of the present invention.

FIG. 7a illustrates pre- and post-programming plots of $I_{Off}$-$V_{DS}$ characteristics of a memory cell configured in accordance with an embodiment of the present invention. As can be seen in this example embodiment, at the same $I_{Off}$ (designated with dashed line), $V_{DS\_2}:V_{DS\_1}=950:50=19:1$, where $V_{DS\_2}$ refers to a programmed memory element (e.g., $Q_{Mem}$) and $V_{DS\_1}$ refers to a reference element (e.g., $Q_{Ref}$). Thus, for a fixed sense voltage (e.g., $V_{DS}=1.0V$), this means that 95% of the applied voltage is dropped across the programmed memory element (e.g., $Q_{Mem}$), whereas only 5% is dropped across the reference element (e.g., $Q_{Ref}$).

Figure 7B:
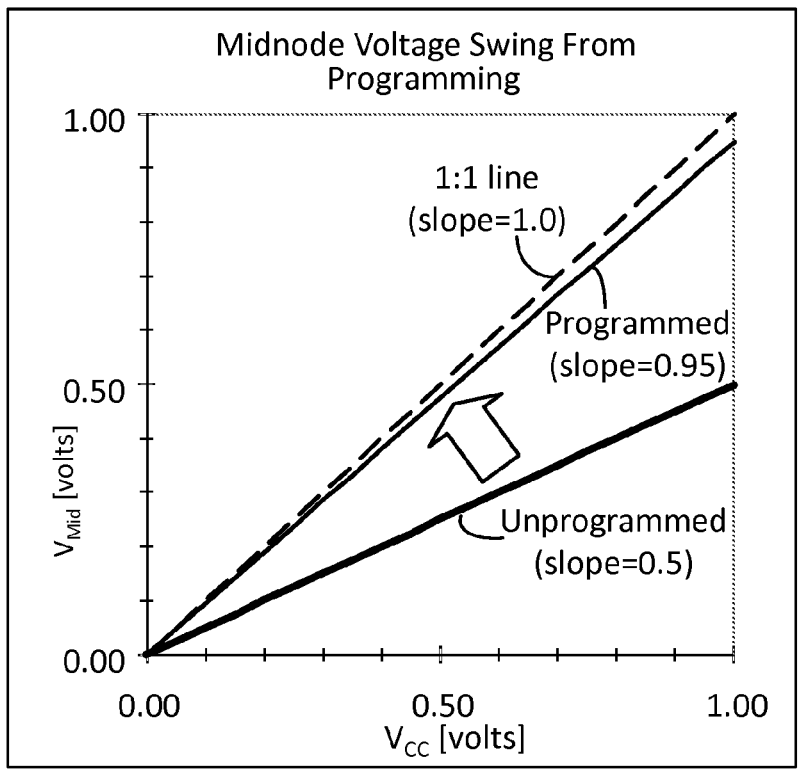
FIG. 7b illustrates the relationship between the $V_{Mid}$ and $V_{CC}$ for a programmed and unprogrammed memory element configured in accordance with an embodiment of the present invention.

FIG. 7b illustrates the relationship between the $V_{Mid}$ and the applied $V_{CC}$ for a programmed and unprogrammed memory cell configured in accordance with an embodiment of the present invention. The dashed line in this example shows the extreme state where $V_{Mid}=V_{CC}$ to provide a slope of 1. The lower solid line shows the unprogrammed state where $V_{Mid}=0.5V_{CC}$ to provide a slope of 0.5, and the middle solid line shows the programmed state where $V_{Mid}=0.95V_{CC}$ to provide a slope of 0.95. As will be appreciated in light of this disclosure, the slope of the line reflecting the programmed state can be anywhere between the slopes of the corresponding unprogrammed state and the $V_{Mid}=V_{CC}$ state.

Figure 8A:
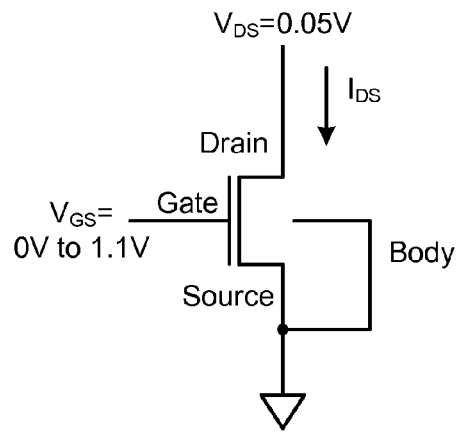
FIGS. 8a, 8b, 8c, and 8d each illustrate a memory element under various conditions, in accordance with an embodiment of the present invention.
Figure 8B:
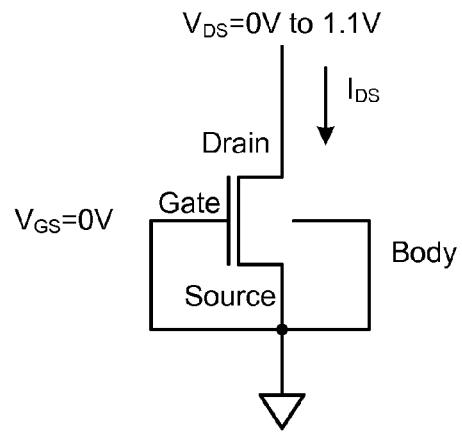
Figure 8C:
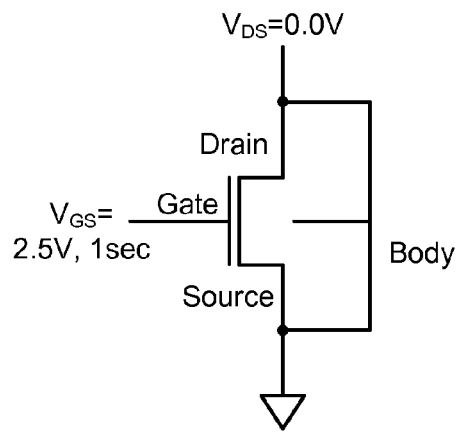
Figure 8D:
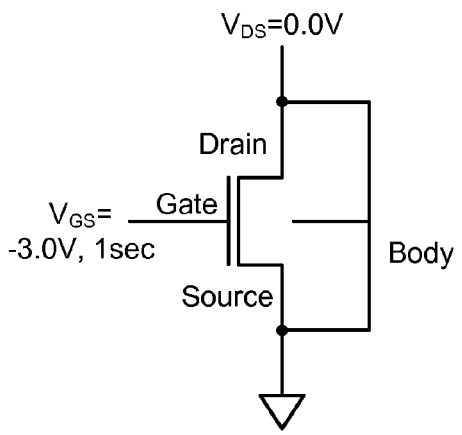

FIGS. 8a, 8b, 8c, and 8d each illustrate an NMOS memory element (e.g., $Q_{Mem}$) under various conditions, in accordance with an embodiment of the present invention. FIG. 8a characterizes $I_{DS}$-$V_{GS}$ when $V_{DS}=0.05V$ and $V_{GS}=0.0V$ to 1.1V. The transistor body is tied the source, and the gate and drain are independent. FIG. 8b characterizes $I_{DS}$-$V_{DS}$ when $V_{DS}=0.0V$ to 1.1V and $V_{GS}=0.0V$. The transistor gate and body are tied to the source, the drain is independent. FIG. 8c characterizes a programming condition when $V_{DS}=0.0V$ and $V_{GS}=2.5V$, for 1 second. The transistor source, body, and drain are all tied together, and the gate is independent. FIG. 8d characterizes an erasing condition when $V_{DS}=0.0V$ and $V_{GS}$=−3.0V, for 1 second. Just as in FIG. 8c, the transistor source, body, and drain are tied together, and the gate is independent. In this example, the programming is done by applying 2.5V inversion stress for 1 second, and erasing is done by applying −3.0V for 1 second. Other embodiments using different programming and erasing voltages will be apparent in light of this disclosure. In a more general sense, the magnitude of the programming and erasing voltages are sufficiently high to provide the desired programming/erasing function but low enough not to cause gate oxide breakdown.

The ability to program/unprogram/reprogram multiple times is also enabled in some embodiments of the present invention. In one example test array configured with high-k+ metal gate NMOS transistors fabricated using conventional 32 nm process technology and having breakdown voltage of about 2.6V, a programming voltage ($V_{Prog}$) of +2V for 1 second was used to program the memory elements, and −2.5V for 1 second was used to unprogram the memory elements. A consistent $V_t$ 80 mV shift between the programmed and unprogrammed states was obtained. At such voltage levels, the memory elements can readily support hundreds of cycles. However, in accordance with some embodiments, modifications can be used to improve the performance of the cell (if so desired). For example, using transistors that have wider gate lengths (relative to the default minimum gate length) can be used to enable more programming/erase cycles before the gate oxide wear-out occurs. For example, 32 nm is the default minimum gate length in a 32 nm process mode, but the transistor could be configured with, for instance, a gate length of 116 nm. Also, a thicker high-k oxide layer (relative to the default thickness) can be used to increase the number of programming/erase cycles. In more detail, a high-k layer is typically deposited by atomic layer deposition, one atomic layer at a time, and the thickness is described in cycles (rather than in Angstroms). So, if the default thickness is, for example, 20 cycles, having a thicker high-k oxide layer by, for instance, doing 24 or 28 cycles will improve the reliability of the high-k oxide and allow more read write cycles before oxide wear-out occurs.

The high-k gate oxide of the memory and reference transistors may comprise any suitable high-k gate dielectrics and treatments, depending on factors such as desired isolation. In some example embodiments, the high-k gate oxide can be, for instance, a film having a thickness in the range of 5 Å to 50 Å (e.g., 20 Å) or any desired number of atomic layer deposition cycles, and can be implemented, for instance, with hafnium oxide, alumina, tantalum pentaoxide, zirconium oxide, lanthanum aluminate, gadolinium scandate, hafnium silicon oxide, lanthanum oxide, lanthanum aluminum oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or other such materials having a dielectric constant greater than that of, for instance, silicon dioxide. Other suitable high-k oxide materials will be apparent in light of this disclosure.

Memory Array Architecture

Figure 9:
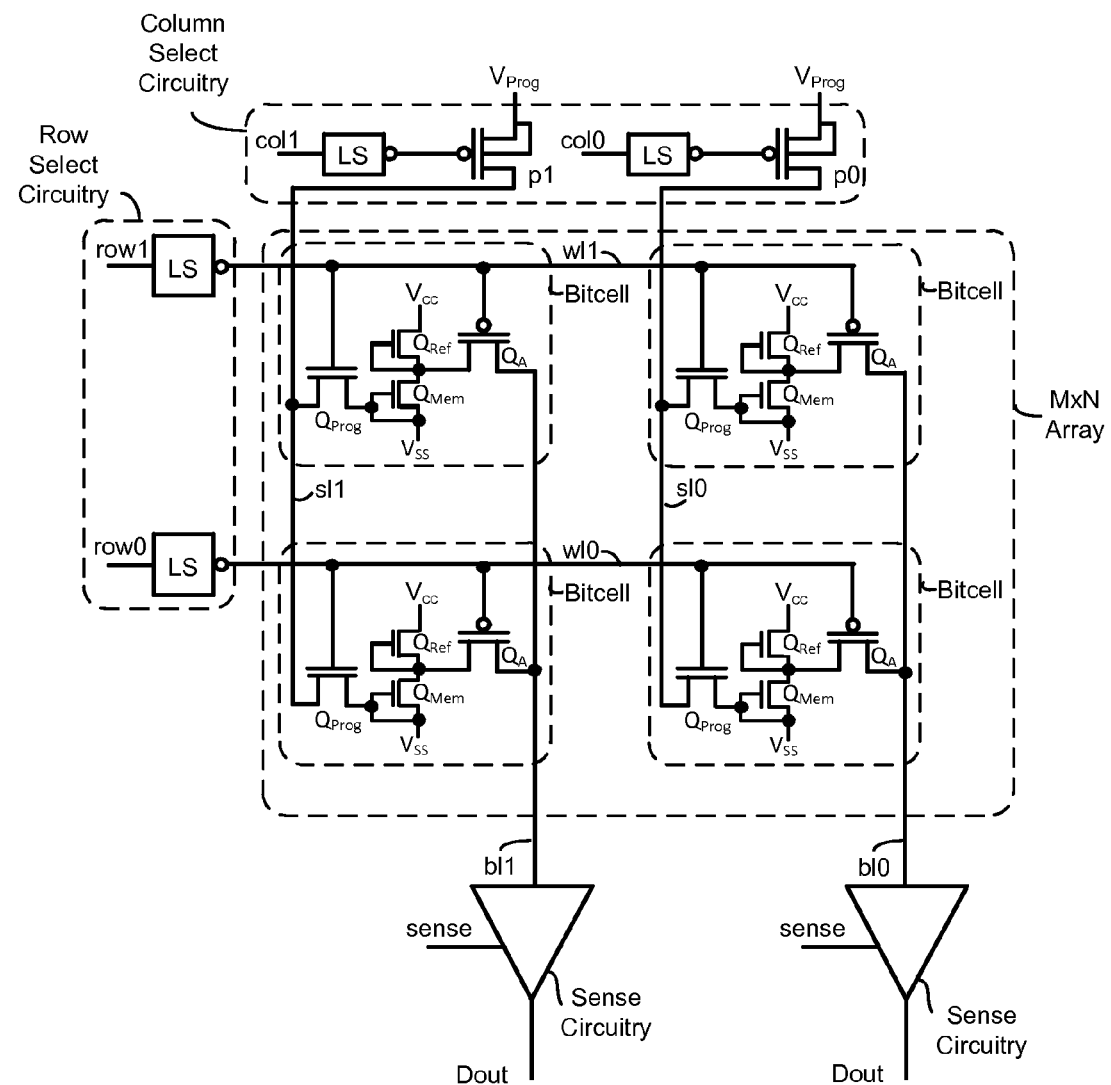
FIG. 9 illustrates a storage device configured in accordance with an embodiment of the present invention.

FIG. 9 illustrates a storage device configured in accordance with an embodiment of the present invention. As can be seen, the device includes column select circuitry, row select circuitry, and an M×N array of bitcells (only 2×2 array is shown, but M and N can be any integer values, as will be appreciated). The actual array size will depend on the given application. Specific examples include a 32-row by 32-column organization, a 64-row by 64-column organization, or a 32-row by 128-column organization. Further note that the number of rows M need not match the number of columns N.

As can be seen, each column is associated with its own source line (sl0, sl1, . . . , slN-1), and each source line is driven by a corresponding column select circuit included in the column select circuitry. In this example embodiment, each column select circuit includes a conventional PMOS transistor (p0, p1, . . . , pN) that has its gate directly driven by an optional level shifter LS which is directly controlled by a corresponding column signal (e.g., col0, col1, . . . , colN). The optional level shifters, which can be implemented as conventionally done, are configured to interface the nominal voltage domain (e.g., Vss to Vcc, such as 0 to 1.1V) with a high-voltage domain (e.g., Vss to HV, such as 0 to 4V), if applicable. For instance, a level shifter converts a low level (0V) input signal to a high-voltage (HV) output signal. Numerous suitable level shifter circuits will be apparent in light of this disclosure, and the claimed invention is not intended to be limited to any particular one; rather, any circuitry capable of converting from one voltage domain to another can be used, assuming more than one voltage domain is desirable. As will be appreciated in light of this disclosure, some embodiments can be configured to accommodate both nominal voltage levels and $V_{Prog}$ levels within a single nominal voltage domain (e.g., 0 to 2.5V), thereby eliminating the need for a separate high-voltage domain.

TABLE 2

| Input | Output |
|---|---|
| low (e.g., 0 V) | high (e.g., 4 V) |
| high (e.g., 1.1 V) | low (e.g., 0 V) |

Table 2 illustrates the output of a level shifter given the state of its input, in accordance with one example embodiment of the present invention. A logic high column signal (e.g., col0, etc.) causes the corresponding level shifter LS to output a logic low, which in turn cause the corresponding PMOS transistor (e.g., p0, etc.) to turn on (closed switch), effectively selecting that column for programming, as will be explained in turn. On the other hand, a logic low column signal causes the corresponding level shifter to output a logic high, which in turn causes the corresponding PMOS transistor to turn off (open switch), effectively deselecting that column. Without the level shifters, note that the column signals (e.g., col0, etc.) can be provided in the appropriate state, without the need for inversion. The source lines (sl0, sl1, . . . , slN-1) allow the programming bias $V_{Prog}$ to be provided to the programming transistors $Q_{Prog}$ of that particular column.

Thus, in this example embodiment of FIG. 9, each column includes a PMOS transistor (p0, p1, etc.) for column selection, M rows of bitcells, and sense circuitry. In addition, the row select circuitry of this example embodiment is implemented with M optional level shifters LS, which can be configured in a similar fashion to the level shifters included in the column select circuitry. Each level shifter is driven by a corresponding logic signal (e.g., row0, row1, . . . , rowM), and outputs a corresponding word line (wl0, wl1, . . . , wlM-1). The column and row select circuitries can be controlled to select specific bitcells (or groups of bitcells) for either programming (where data is written to a cell) or sensing (where data is read from a cell).

As previously explained, each bitcell of the M×N array includes a reference element $Q_{Ref}$ and a memory element $Q_{Mem}$ for storing the memory cell state. In the example embodiment shown, each of $Q_{Ref}$ and $Q_{Mem}$ is implemented with a high-k oxide metal gate NMOS transistor. Table 3 demonstrates the switching operation of high-k oxide metal gate NMOS transistors, in accordance with one example embodiment of the present invention. Note that other devices included in the memory cell can be thick gate or thin gate, depending on factors such as the desired voltage levels and cell size. Further note that if the memory element $Q_{Mem}$ does not require a high voltage for programming, then the program transistor $Q_{Prog}$ can have a thin gate also.

TABLE 3

| Gate | Switch State |
| --- | --- |
| low (e.g., 0 V) | Off (open) |
| high (e.g., 1.1 V) | On (closed) |

In operation, the column select circuitry is only 'on' during programming; otherwise, transistors p0, p1, etc. . . . are off and $V_{Prog}$ is not supplied to the columns. During programming, the row select circuitry turns $Q_{Prog}$ on and the access transistor $Q_A$ off. During readout/sensing, the row select circuitry turns $Q_{Prog}$ off and $Q_A$ on. Note that the programming transistor $Q_{Prog}$ and the access transistor $Q_A$ of each cell are complementary (i.e., $Q_A$ is PMOS and $Q_{Prog}$ is NMOS) to allow for control of both the programming and sensing functions by a single word line. Each of $Q_{Prog}$ and $Q_A$ can be implemented using conventional processing and numerous configurations will be apparent in light of this disclosure. For instance, note that $Q_A$ can be implemented with NMOS technology with the addition of an inverter at its gate, if so desired. In addition, note that the memory cell may only include two transistors ($Q_{Mem}$ and $Q_{Ref}$) and $Q_{Prog}$ and $Q_A$ can be implemented externally to the memory cell. For example, each of the $Q_{Prog}$ transistors can be integrated into the column select circuitry and each of the $Q_A$ transistors can be integrated into the sense circuitry.

Figure 10:
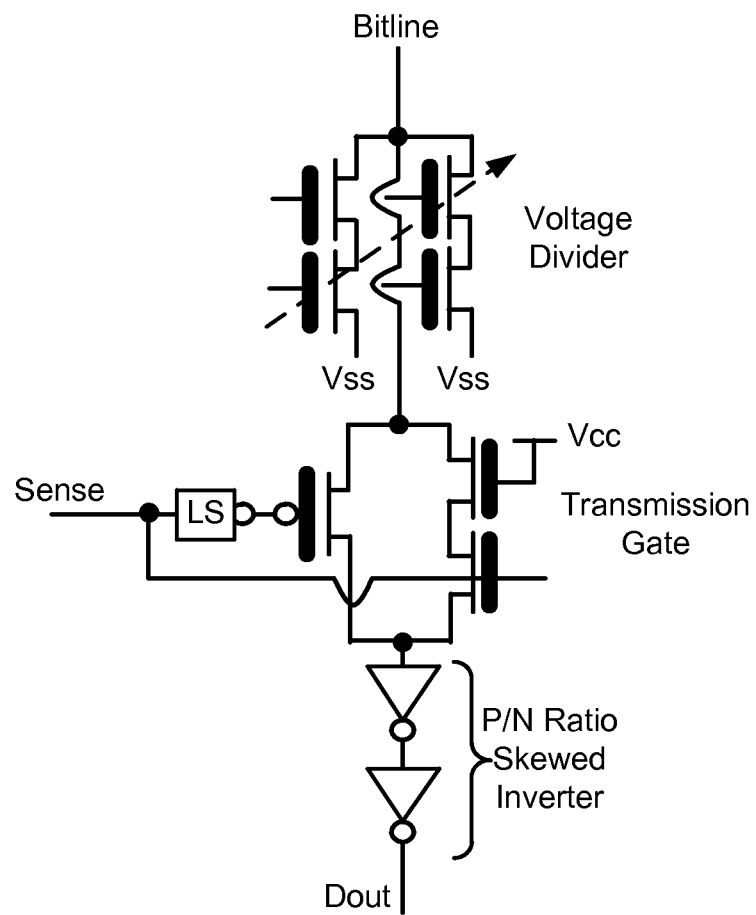
FIG. 10 illustrates example sense circuitry that can be used with devices configured in accordance with an embodiment of the present invention.

A voltage division is created between the memory cell resistance (pre/post stress resistances for unprogrammed/programmed cells, respectively) and a voltage divider within the sense circuitry, allowing for readout of the cell. In the example embodiment shown in FIG. 9, during sensing, all columns along a row are sensed simultaneously. As can be seen with the example sense circuitry shown in FIG. 10, the voltage divider can be made tunable to facilitate process learning and margin mode measurements, as is sometimes done. This voltage divided signal is passed through a transmission gate to an analog P/N ratio skewed inverter. A logical high or low value is delivered at the output (Dout) for unprogrammed/programmed cells. The sense signal effectively enables the sense amplifier, and can be provided, for example, by decoder logic. The sense signal passes through a level shifter LS in this example configuration. Note, however, that the level shifter can be eliminated in other embodiments as previously explained. Any number of other suitable sense amplifiers can be used here, as will be apparent in light of this disclosure, and FIG. 10 merely shows example circuitry. For instance, the voltage divider and transmission gate are shown with thick gate PMOS transistors in this example. In other embodiments, the voltage divider and/or transmission gate can be thin gate construction, if so desired, given the elimination of high voltage on the bitlines, in accordance with some embodiments. The claimed invention is not intended to be limited to any particular sense circuit; rather, any circuitry capable of reading out a bitcell value can be used.

Numerous embodiments will be apparent in light of this disclosure. One example embodiment of the present invention provides a storage device. The device includes a first high-k oxide metal gate MOS transistor having its source tied to a sense node, and for providing a reference resistance of the device. The device further includes a second high-k oxide metal gate MOS transistor having a breakdown voltage and its drain tied to the sense node, and for providing a memory resistance of the device. The storage device can be programmed by applying a programming bias that is lower than the breakdown voltage to the gate of the second high-k oxide metal gate MOS transistor, thereby causing a sense node voltage level increase that can be detected during sensing. In some such embodiments, each of the first and second high-k oxide metal gate MOS transistors has a high-k gate oxide having a dielectric constant greater than that of silicon dioxide. In some embodiments, applying the programming bias causes a shift in threshold voltage of the second high-k oxide metal gate MOS transistor in the range of 50 mV to 500 mV. In other such embodiments, applying the programming bias causes a shift in threshold voltage of the second high-k oxide metal gate MOS transistor in the range of 50 mV to 200 mV. In other such embodiments, applying the programming bias causes the memory resistance to increase to more than 10× the reference resistance. In some cases, the device is configured to be unprogrammed by applying a bias having an opposite polarity relative to the programming bias and can subsequently be re-programmed, and this unprogramming/re-programming process can be carried out multiple times. In some cases, applying the programming bias for a first time period causes the memory resistance to increase to a first level and applying the programming bias for a second time period causes the memory resistance to increase to a second level. In one particular embodiment, the device includes a programming transistor for selectively coupling the programming bias to the gate of the second high-k oxide metal gate MOS transistor, and/or an access transistor for selectively coupling the sense node to sensing circuitry. In some embodiments, each of the first and second high-k oxide metal gate MOS transistors is included in a bitcell of the device, and the device includes an array of such bitcells. In some specific embodiments, the device can be, for example, a nonvolatile memory (e.g., erasable PROM) or programmable logic circuit.

Another embodiment of the present invention provides a storage device including a first high-k oxide metal gate NMOS transistor having its source tied to a first node, and for providing a reference resistance of the device. The device further includes a second high-k oxide metal gate NMOS transistor having a first breakdown voltage and its drain tied to the first node and its source tied to a sense node, and for providing a first memory resistance of the device. The device further includes a third high-k oxide metal gate NMOS transistor having a second breakdown voltage and its drain tied to the sense node, and for providing a second memory resistance of the device. The storage device can be programmed, for example, by at least one of applying a first programming bias that is lower than the first breakdown voltage to the gate of the second high-k oxide metal gate NMOS transistor and/or applying a second programming bias that is lower than the second breakdown voltage to the gate of the third high-k oxide metal gate NMOS transistor, thereby causing a sense node voltage level change that can be detected during sensing. In one example case, each of the first, second, and third high-k oxide metal gate NMOS transistors has a high-k gate oxide having a dielectric constant greater than that of silicon dioxide. In another example case, applying the first programming bias causes a shift in threshold voltage of the second high-k oxide metal gate NMOS transistor in the range of 50 mV to 500 mV, and applying the second programming bias causes a shift in threshold voltage of the third high-k oxide metal gate NMOS transistor in the range of 50 mV to 500 mV. In another example case, the first and second breakdown voltages are substantially the same. In another example case, applying the first programming bias causes the device to have a first state, and applying the second programming bias causes the device to have a second state that is different than the first state. In another example case, the device is configured to be unprogrammed by applying a bias having an opposite polarity relative to a previously applied programming bias and can subsequently be re-programmed, and this unprogramming/re-programming process can be carried out multiple times. In another example case, applying the first or second programming bias for a first time period causes the first or second memory resistance to increase to a first level, and applying the first or second programming bias for a second time period cause the first or second memory resistance to increase to a second level. In another example case, the device further includes a first programming transistor for selectively coupling the first programming bias to the gate of the second high-k oxide metal gate NMOS transistor, a second programming transistor for selectively coupling the second programming bias to the gate of the third high-k oxide metal gate NMOS transistor, and/or an access transistor for selectively coupling the sense node to sensing circuitry. In another example case, each of the first, second, and third high-k oxide metal gate NMOS transistors is included in a bitcell of the device, and the device includes an array of such bitcells. In another example case, the device is a nonvolatile memory or programmable logic circuit.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A device, comprising:
   a first high-k oxide metal gate MOS transistor having its source tied to a sense node; and
   a second high-k oxide metal gate MOS transistor having a breakdown voltage and its drain tied to the sense node;
   wherein the device is erasably programmable by applying a programming bias that is lower than the breakdown voltage to the gate of the second high-k oxide metal gate MOS transistor.

2. The device of claim 1 wherein each of the first and second high-k oxide metal gate MOS transistors has a high-k gate oxide having a dielectric constant greater than that of silicon dioxide.

3. The device of claim 1 wherein applying the programming bias causes a shift in threshold voltage of the second high-k oxide metal gate MOS transistor in the range of 50 mV to 500 mV.

4. The device of claim 1 wherein applying the programming bias causes a shift in threshold voltage of the second high-k oxide metal gate MOS transistor in the range of 50 mV to 200 mV.

5. The device of claim 1 wherein applying the programming bias causes a memory resistance of the device to increase to more than 10× a reference resistance of the device.

6. The device of claim 1 wherein the device is configured to be unprogrammed by applying a bias having an opposite polarity relative to the programming bias and can subsequently be re-programmed.

7. The device of claim 1 wherein applying the programming bias for a first time period causes a memory resistance of the device to increase to a first level and applying the programming bias for a second time period causes the memory resistance to increase to a second level.

8. The device of claim 1 further comprising at least one of:
   a programming transistor for selectively coupling the programming bias to the gate of the second high-k oxide metal gate MOS transistor; and
   an access transistor for selectively coupling the sense node to sensing circuitry.

9. The device of claim 1 wherein each of the first and second high-k oxide metal gate MOS transistors is included in a bitcell of the device, and the device includes an array of such bitcells.

10. The device of claim 1 wherein the device is a nonvolatile memory or programmable logic circuit.

11. A device, comprising:
    a first high-k oxide metal gate NMOS transistor having its source tied to a first node;
    a second high-k oxide metal gate NMOS transistor having a first breakdown voltage and its drain tied to the first node and its source tied to a sense node; and
    a third high-k oxide metal gate NMOS transistor having a second breakdown voltage and its drain tied to the sense node;
    wherein the device is programmed by at least one of applying a first programming bias that is lower than the first breakdown voltage to the gate of the second high-k oxide metal gate NMOS transistor and/or applying a second programming bias that is lower than the second breakdown voltage to the gate of the third high-k oxide metal gate NMOS transistor.

12. The device of claim 11 wherein each of the first, second, and third high-k oxide metal gate NMOS transistors has a high-k gate oxide having a dielectric constant greater than that of silicon dioxide.

13. The device of claim 11 wherein applying the first programming bias causes a shift in threshold voltage of the second high-k oxide metal gate NMOS transistor in the range of 50 mV to 500 mV, and applying the second programming bias causes a shift in threshold voltage of the third high-k oxide metal gate NMOS transistor in the range of 50 mV to 500 mV.

14. The device of claim 11 wherein the first and second breakdown voltages are substantially the same.

15. The device of claim 11 wherein applying the first programming bias causes the device to have a first state, and applying the second programming bias causes the device to have a second state that is different than the first state.

16. The device of claim 11 wherein the device is configured to be unprogrammed by applying a bias having an opposite polarity relative to a previously applied programming bias and can subsequently be re-programmed.

17. The device of claim 11 further comprising at least one of:
    a first programming transistor for selectively coupling the first programming bias to the gate of the second high-k oxide metal gate NMOS transistor;
    a second programming transistor for selectively coupling the second programming bias to the gate of the third high-k oxide metal gate NMOS transistor; and
    an access transistor for selectively coupling the sense node to sensing circuitry.

18. The device of claim 11 wherein each of the first, second, and third high-k oxide metal gate NMOS transistors is included in a bitcell of the device, and the device includes an array of such bitcells.

19. A programmable device, comprising:
- a bitcell configured with a first high-k oxide metal gate MOS transistor having its source tied to a sense node and a second high-k oxide metal gate MOS transistor having a breakdown voltage and its drain tied to the sense node; and
- a programming transistor configured to selectively couple a programming bias to the gate of the second high-k oxide metal gate MOS transistor to erasably program the device, the programming bias being lower than the breakdown voltage.

20. The device of claim 19 wherein the device is configured to be unprogrammed by applying a bias having an opposite polarity relative to a previously applied programming bias and can subsequently be re-programmed.

21. A device, comprising:
- a first transistor having its source tied to a sense node, and configured with a gate dielectric having a dielectric constant greater than that of silicon dioxide;
- a second transistor having a breakdown voltage and its drain tied to the sense node, and configured with a gate dielectric having a dielectric constant greater than that of silicon dioxide;
- a programming transistor for selectively coupling a programming bias to the gate of the second transistor, the programming bias being lower than the breakdown voltage, and wherein the device is erasably programmable by applying the programming bias to the gate of the second transistor; and
- an access transistor for selectively coupling the sense node to sensing circuitry;
- wherein each of the first and second transistors is included in a bitcell of the device, and the device includes an array of such bitcells.

22. The device of claim 21 wherein each of the first and second transistors is a high-k oxide metal gate MOS transistor.

23. The device of claim 21 wherein each of the programming and access transistors is included in the bitcell of the device.

24. The device of claim 21 wherein the first transistor also has a breakdown voltage and the device is also erasably programmable by applying a programming bias that is lower than the breakdown voltage of the first transistor to the gate of the first transistor, the device further comprising a third transistor having its source tied to a first node, wherein the first transistor has its drain is tied to the first node.

* * * * *